(12) United States Patent
Abe

(10) Patent No.: US 6,538,212 B1
(45) Date of Patent: Mar. 25, 2003

(54) CIRCUIT BOARD FOR SEMICONDUCTOR DEVICE AND MANUFACTURING METHOD THEREOF

(75) Inventor: Hiroshi Abe, Oita (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 09/484,846

(22) Filed: Jan. 18, 2000

(30) Foreign Application Priority Data

Jan. 20, 1999 (JP) .......................................... 11-011328

(51) Int. Cl.[7] ................................................. H05K 1/11
(52) U.S. Cl. ...................................................... 174/261
(58) Field of Search ................................. 174/261, 250, 174/254, 255; 361/748

(56) References Cited

U.S. PATENT DOCUMENTS

| | | | |
|---|---|---|---|
| 3,973,817 A | * | 8/1976 | Stalley et al. ................. 439/60 |
| 5,112,230 A | * | 5/1992 | DeSimone .................... 439/55 |
| 5,245,135 A | * | 9/1993 | Schreiber et al. ............ 174/261 |
| 5,548,091 A | * | 8/1996 | DiStefano et al. ........... 174/260 |
| 5,821,609 A | * | 10/1998 | DiStefano et al. .......... 257/669 |
| 6,028,489 A | * | 2/2000 | Juang et al. .................. 332/46 |

* cited by examiner

*Primary Examiner*—Tulsidas Patel
(74) *Attorney, Agent, or Firm*—Sonnenschein, Nath & Rosenthal

(57) ABSTRACT

A circuit board for semiconductor devices includes inner leads formed on a board, interconnections extending from the inner leads, and a lead wire formed on the board in such a manner as to short-circuit the interconnections to each other. The inner leads are electroplated by carrying a current to the lead wire of the board dipped in an electroplating solution, and the lead wire of the board is removed after the inner leads are electroplated.

6 Claims, 5 Drawing Sheets

CIRCUIT BOARD FOR SEMICONDUCTOR DEVICE AND MANUFACTURING METHOD THEREOF

BACKGROUND OF THE INVENTION

The present invention relates to a circuit board for semiconductor devices, in which interconnections are individually subjected to electric circuit testing in a state in which the semiconductor devices remain mounted on the board, and a method of manufacturing the circuit board for semiconductor devices.

Inner leads of a circuit board for semiconductor devices are often electroplated for ensuring desirable electric connection with semiconductor chips. In this case, interconnections extending from the inner leads desired to be electroplated are short-circuited for current-carrying. FIG. 6 shows a related art circuit board 1 for semiconductor devices of this type. In this circuit board 1, to increase the number of semiconductor devices per unit area, interconnections 3 are collectively connected to lead wire patterns 5 for electroplating which are formed as a pattern on the board 1.

The board 1 is dipped in an electroplating solution, and inner leads are electroplated by carrying a current to the lead wire patterns 5 for electroplating. After the inner leads are electroplated, a semiconductor chip (not shown) is mounted on each die pad portion 7 of the board 1, and the inner leads are connected to bump electrodes of the semiconductor chip by using an inner lead bonder, so that the bump electrodes are connected to a plurality of terminals provided on the underside of the board 1. Then, the upper surface, on which the inner leads are formed, of the board 1 is sealed with a sealing resin, and the sealing resin is cut in such a manner that the lead wire pattern 5 for electroplating is cut off, to thereby take a plurality of semiconductor devices out of the board 1.

The related art circuit board for semiconductor devices, however, has a disadvantage. In this circuit board, until just before the sealing resin is cut, the lead wire pattern for electroplating remains and thereby the interconnections and the terminals remain short-circuited to each other, and accordingly, the interconnections cannot be subjected to electric circuit testing in the state in which the semiconductor devices are mounted on the board. As a result, there is a possibility that semiconductor devices, which have defects in the state being mounted on the board, are assembled. This becomes one factor of reducing the yield of the assembled semiconductor devices.

FIG. 7 shows another related art circuit board for semiconductor devices, in which lead wire patterns 5 for electroplating are individually led from interconnections 3. In this circuit boars, the interconnections 3 can be subjected to electric circuit testing in the state in which the semiconductor devices are mounted on the board; however, there arises a problem that the number of semiconductor devices within the board is significantly reduced, to thereby raise the assembling cost.

FIGS. 8 and 9 show a further related art circuit board for semiconductor devices, in which a lead wire pattern for electroplating is cut off by forming through-holes 9 in the board 1. In this circuit board, interconnections can be subjected to electric circuit testing in the state in which the semiconductor devices are mounted on the board 1; however, there arises a problem that the sealing resin is leaked to a terminal portion on the back surface of the board 1, leading to occur a failure.

SUMMARY OF THE INVENTION

An object of the present invention is to provide a circuit board for semiconductor devices, which is capable of subjecting interconnections to electric circuit testing without a reduction in the number of semiconductor devices within the board, and preventing leakage of resin to a terminal portion on the back surface of the board, thereby improving the assembling yield, and reducing the failures and the assembling cost, and a method of manufacturing the circuit board for semiconductor devices.

To achieve the above object, according to a first aspect of the present invention, there is provided a circuit board for semiconductor devices, including: inner leads formed on a board; interconnections extending from the inner leads; and a lead wire formed on said board in such a manner as to short-circuit the interconnections to each other; wherein the inner leads are electroplated by carrying a current to the lead wire of the board dipped in an electroplating solution; and the lead wire of the board is removed after the inner leads are electroplated.

With this configuration, since the lead wire is removed after the inner leads are electroplated, the interconnections extending from the inner leads, connected to each other via the lead wire, are made independently non-conductive. Accordingly, each of the interconnections can be subjected to electric circuit testing. Also, since lead wires are not required to be extracted from individual interconnections, the number of semiconductor devices within the board is not reduced. Further, since the through-holes are not formed in the board the leakage of the resin does not occur to a terminal portion on the back surface of the board. As a result, it is possible to eliminate an inconvenience that defective semiconductor devices in the state being mounted on the board are assembled, and hence to improve the assembled semiconductor devices and reduce the assembling cost.

According to a second aspect of the present invention, there is provided a method of manufacturing a circuit board for semiconductor devices, which includes inner leads formed on a board, interconnections extending from the inner leads, and a lead wire formed on the board in such a manner as to short-circuit the board in such a manner as to short-circuit the interconnections to each other, the method including the steps of: electroplating the inner leads by carrying a current to the lead wire of the board dipped in an electroplating solution; and removing, after the electroplating step, the lead wire by chemical corrosion.

With this configuration, after the inner leads are electroplated, the lead wire is removed by chemical corrosion, and accordingly, it is possible to eliminate the necessity of formation of through-holes for removal of the lead wire in the board, and hence to eliminate the leakage of resin and the reduction in strength of the board.

According to a third aspect of the present invention, there is provided a method of manufacturing a circuit board for semiconductor devices, which includes inner leads formed on a board, interconnections extending from the inner leads, and a lead wire formed on the board in such a manner as to short-circuit the interconnections to each other, the method including the steps of: electroplating the inner leads by carrying a current to the lead wire of the board dipped in an electroplating solution; and removing, after the electroplating step, the lead wire and part of the board in the thickness direction from the surface on which the lead wire is formed, by mechanical polishing.

With this configuration, after the inner leads are electroplated, the lead wire and part of the board in the thickness direction from the surface on which the lead wire is formed are removed by mechanical polishing, and accordingly, it is possible to eliminate the necessity of formation of through-holes for removing the lead wire, and hence to eliminate the leakage of the resin and also remove the lead wire by using a relatively inexpensive apparatus as compared with the chemical corrosion manner.

DETAILED DESCRIPTION OF THE PREFERRED EMBODIMENT

Hereinafter, a preferred embodiment of a circuit board for semiconductor devices and a method of manufacturing method thereof according to the present invention will be described with reference to the drawings.

Figure 1:
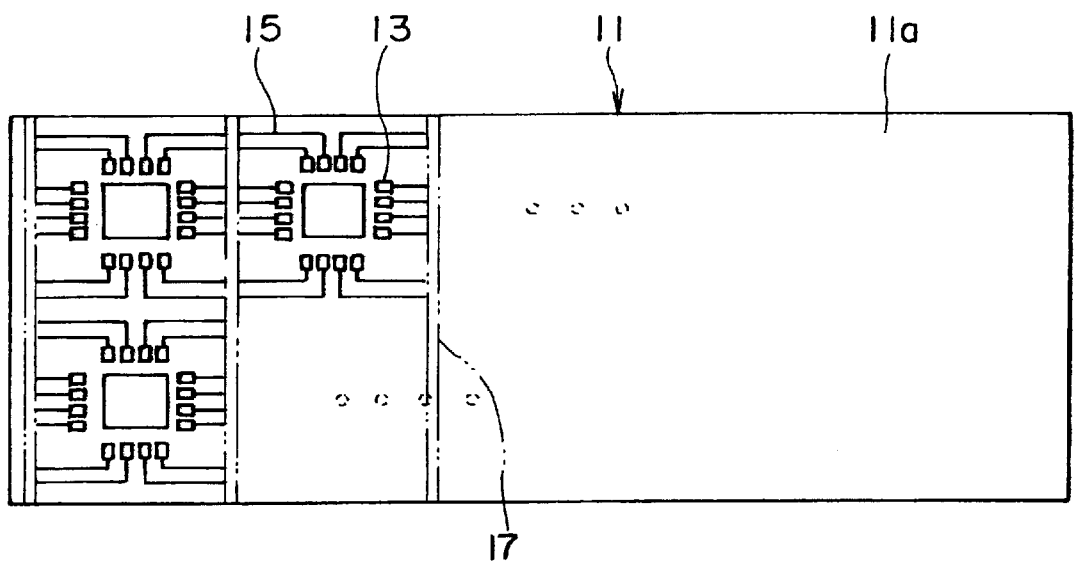
FIG. 1 is a plan view of a circuit board for semiconductor devices according to the present invention.
Figure 2:
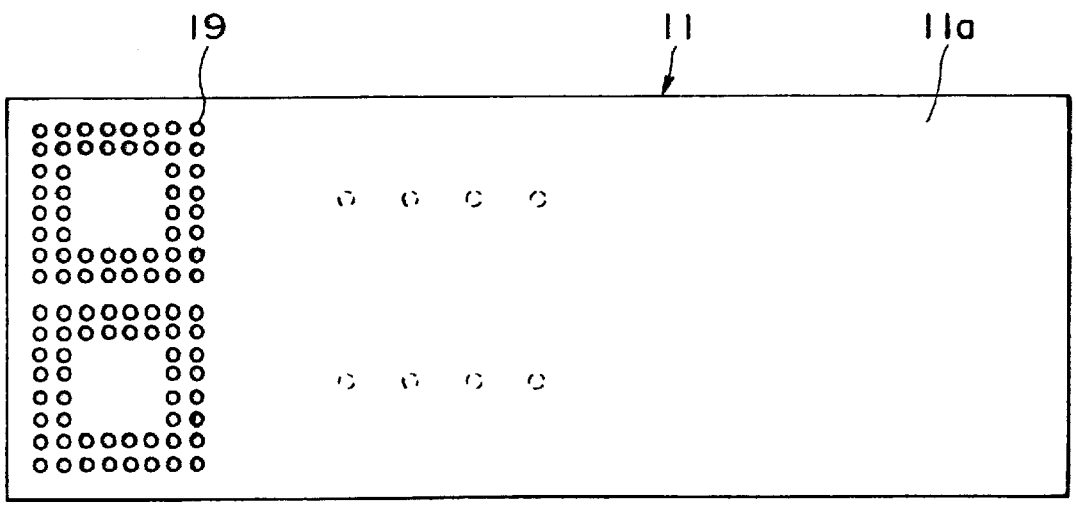
FIG. 2 is a rear view of the circuit board for semiconductor devices shown in FIG. 1.
Figure 3:
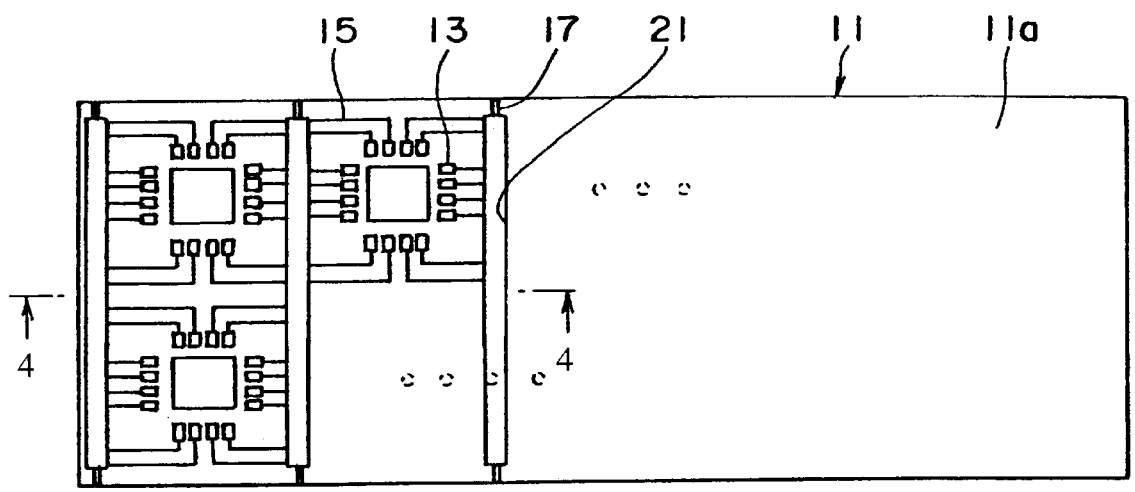
FIG. 3 is a plan view of the circuit board for semiconductor devices, shown in FIG. 1, from which a lead wire is removed by mechanical polishing.
Figure 4:
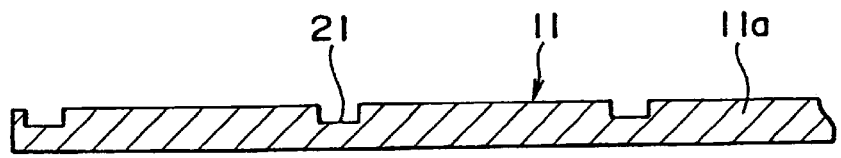
FIG. 4 is a sectional view taken on line 4—4 of FIG. 3.

FIG. 1 is a plan view of a circuit board for semiconductor devices according to the present invention; FIG. 2 is a rear view of the circuit board for semiconductor devices shown in FIG. 1; FIG. 3 is a plan view of the circuit board for semiconductor devices, from which a lead wire pattern is removed by mechanical polishing; FIG. 4 is a sectional view taken on line 4—4 of FIG. 3; FIGS. 5A to 5D are views showing a procedure of assembling semiconductor devices by using the circuit board for semiconductor devices according to the present invention.

Figure 6:
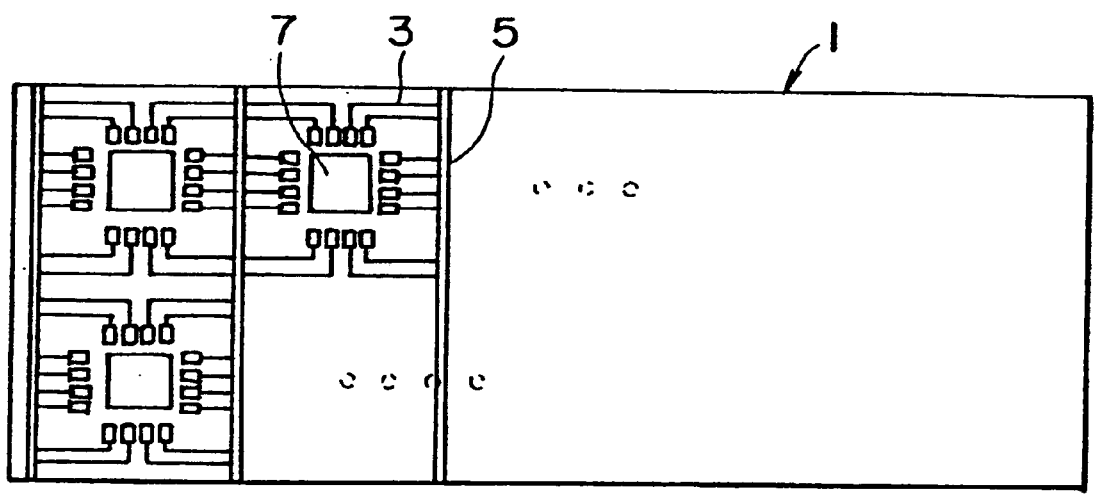
FIG. 6 is a plan view of a related art circuit board for semiconductor devices.
Figure 7:
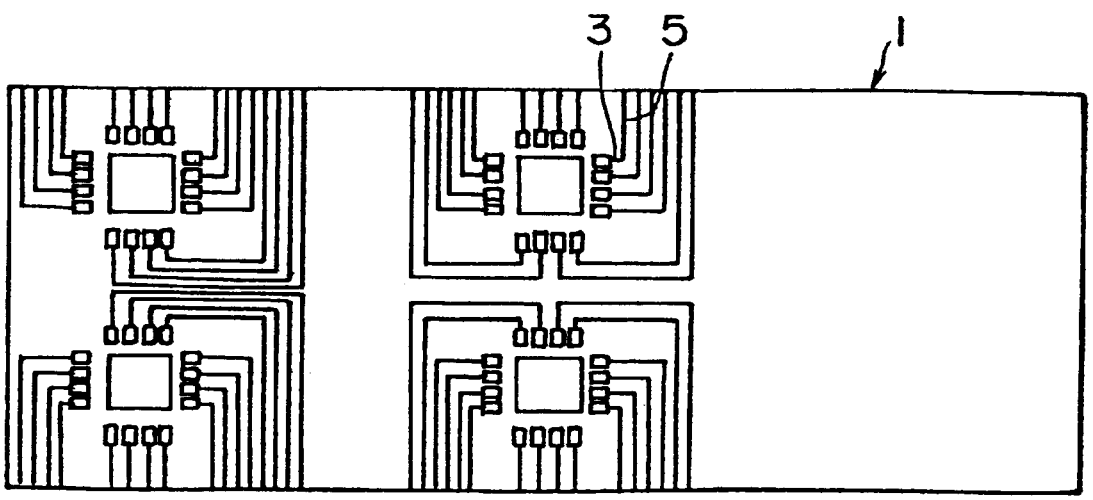
FIG. 7 shows another related art circuit board for semiconductor devices, in which lead wire patterns 5 for electroplating are individually led from interconnections. In this circuit board, the interconnection can be subjected to electric circuit testing in the state in which the semiconductor devices are mounted on the board; however, there arises a problem that the number of semiconductor devices within the board is significantly reduced, to thereby raise the assembling cost.
Figure 8:
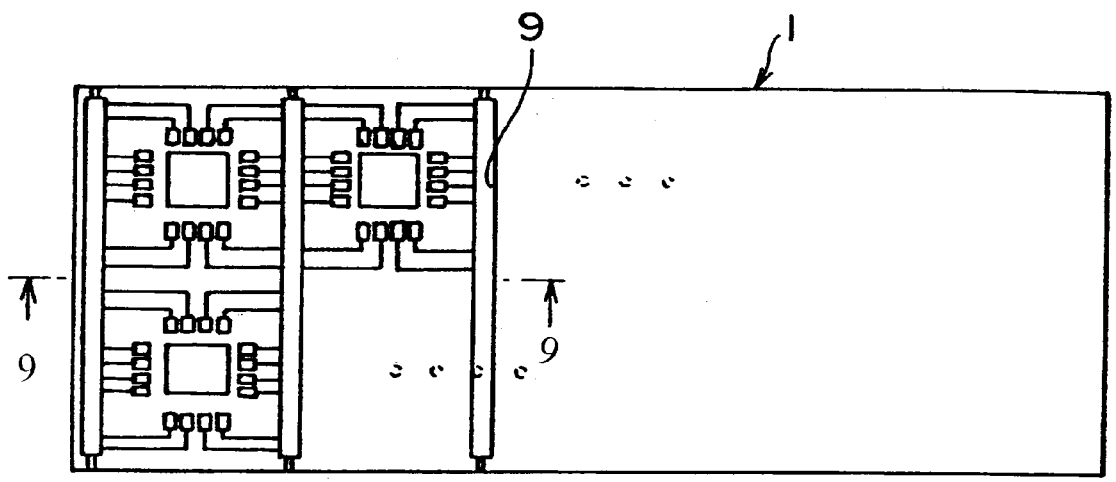
FIG. 8 is a plan view of another related art circuit board for semiconductor devices, in which a lead wire for electroplating is cut by forming through-holes.

In a circuit board 11 for semiconductor devices in this embodiment, like the related art circuit board for semiconductor devices, inner leads 13 are electroplated for electric connection with semiconductor chips in the following procedure. Interconnections 15 are provided in such a manner as to extend from the inner leads 13, and to carry a current to the interconnections 15 upon electroplating, the interconnections 15 are short-circuited to each other by lead wire patterns 17 for electroplating, which are shown by virtual two-dot chain lines in FIG. 1. The lead wire patterns 17 for electroplating are formed on a board 11a as a pattern to which the interconnections 15 are collectively connected. Accordingly, the number of semiconductor devices for unit area on the board 11a is the same as that in the related art circuit board, for example, shown in FIG. 6.

At the electroplating step, the board 11a is dipped in an electroplating solution, and a current is applied to the lead wire pattern 17 for electroplating, whereby the inner leads 13 are electroplated via the interconnections 15 short-circuited by the lead wire pattern 17. As shown in FIG. 2, semi-spherical terminals 19 are formed on the back surface of the board 11a in such a manner as to be conducted to the interconnections 15. After the inner leads 13 are electroplated, the lead wire pattern 17 for electroplating is removed from the board 11a.

Figure 9:
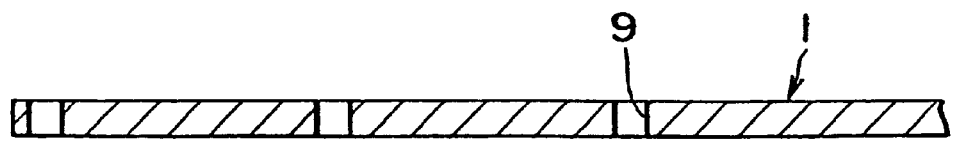
FIG. 9 is a sectional view taken on line 9—9 of FIG. 8.

In the circuit board 11 for semiconductor devices having the above configuration, since the lead wire pattern 17 for electroplating is removed from the circuit board 11 for semiconductor devices, the interconnections 15 extending from the inner leads 13, which are connected to each other by means of the lead wire pattern 17 for electroplating, are independently made non-conductive. As a result, each of the interconnections 15 can be subjected to electric circuit testing. Also, since lead wires are not required to be extracted from individual interconnections 15, the number of semiconductor devices within the circuit board 11 for semiconductor devices is not reduced. Further, since the through-holes 9 (see FIG. 9), having been provided for the related art structure, are not formed in the board 11a, the leakage of the resin does not occur to a terminal portion on the back surface of the board 11a.

The lead wire pattern 17 for electroplating can be removed by chemical polishing, for example, etching. To be more specific, after the inner leads 13 are electroplated, the lead wire pattern 17 for electroplating is removed by chemical corrosion.

With this method by chemical polishing, since the lead wire pattern 17 for electroplating is removed by chemical corrosion after the inner leads 13 are electroplated, it is not required to form through-holes for removing the lead wire pattern 17 for electroplating in the board 11a, so that the leakage of the resin does not occur to the terminal portion on the back surface of the board 11a and the strength of the board 11a is not reduced.

The lead wire pattern 17 for electroplating can be also removed by mechanical polishing using a grindstone or drill. To be more specific, after the inner leads 13 are electroplated, the lead wire pattern 17 for electroplating and also part of the board 11a in the thickness direction are removed by mechanical polishing as shown in FIGS. 3 and 4. With this method, grooves 21 having a shape similar to that of the lead wire pattern 17 for electroplating are formed at portions, where the lead wire pattern 17 for electroplating has been formed, of the board 11a.

Like the method by chemical polishing, the method by mechanical polishing has the following advantage: namely, since it is not required to form through-holes for removing the lead wire pattern 17 for electroplating in the board 11a, the leakage of the resin does not occur to the terminal portion on the back surface of the board 11a. The method by mechanical polishing has another advantage that the lead wire pattern 17 for electroplating can be removed with a relatively low cost as compared with the method by chemical corrosion.

The lead wire pattern 17 for electroplating can be also removed by melting it with a laser beam. With this method, the lead wire pattern 17 for electroplating can be simply removed at a high speed irrespective of the surface condition of the board 11a.

Next, a procedure of assembling semiconductor devices using the circuit board 11 for semiconductor devices, from which the lead wire pattern 17 for electroplating is removed, will be described.

Figure 5A:
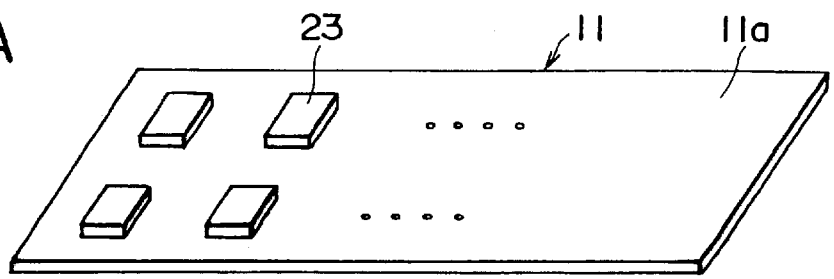
FIGS. 5A to 5D are views showing a procedure of assembling semiconductor devices by using the circuit board for semiconductor devices of the present invention.

Since the lead wire pattern 17 for electroplating is removed from the circuit board 11 for semiconductor devices as described above, the interconnections 15 are individually made non-conductive. Such interconnections 15 are subjected to electric circuit testing. Then, as shown in FIG. 5A, a semiconductor chip 23 is mounted on each die pad portion of the circuit board 11 for semiconductor devices.

Figure 5B:
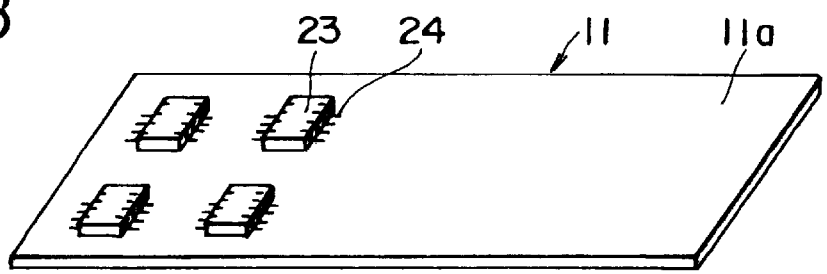

Referring to FIG. 5B, the inner leads 13 of the circuit board 11 for electroplating are connected to bump electrodes of the conductive chip 23 with metal wires 24 by using an inner lead bonder. The bump electrodes are thus connected to a plurality of terminals 19 (see FIG. 2) provided on the underside of the board 11a.

Figure 5C:
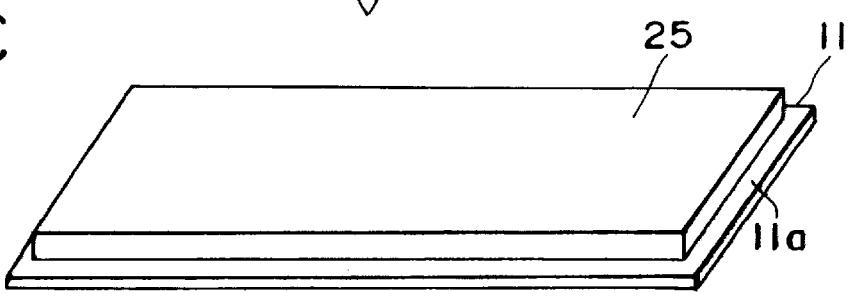

Referring to FIG. 5C, the top surface, on which the inner leads 13 are formed, of the circuit board 11 for semiconductor devices is sealed with a resin 25.

Figure 5D:
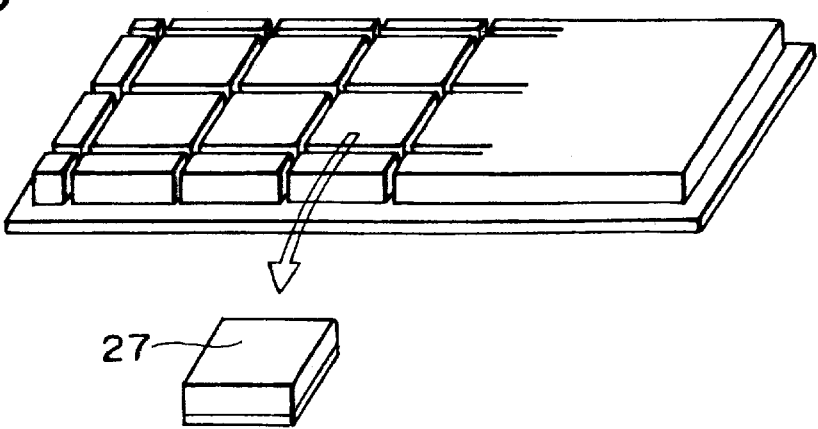

Referring to FIG. 5D, the resin 25 on the circuit board 11 for semiconductor devices is cut into specific sizes equivalent to those of the semiconductor chips 23, whereby a plurality of semiconductor devices 27 are taken out of the circuit board 11 for semiconductor devices.

With this assembling method, at the final step, each semiconductor device is cut into a desired outer size. As a result, semiconductor devices having various sizes can be assembled without additional investment in equipment.

As described above, according to the circuit board 11 for semiconductor devices, it is possible to subject the individual interconnections 15 to electric circuit testing without any reduction in the number of the semiconductor devices 27, and hence to improve the yield of the semiconductor devices 27, and reduce occurrence of defective products and the assembling cost.

While the preferred embodiment of the present invention has been described using the specific terms, such description is for illustrative purposes only and it is to be understood that changes and variations may be made without departing from the spirit or scope of the following claims.

What is claimed is:

1. A circuit board for semiconductor devices, comprising:
   inner leads formed on a board;
   interconnections extending from the inner leads, the interconnections being electrically isolated from each other; and
   a lead wire formed on the board, the lead wire being connected with each interconnection;
   wherein the inner leads are electroplated by the lead wire via the interconnections when the board is dipped in an electroplating solution and the lead wire of the board is subsequently removed without forming through holes on the board to break the short-circuited interconnections after the inner leads are electroplated to individually subject the interconnections to electric circuit testing.

2. A method of manufacturing a circuit board for semiconductor devices, the circuit board including inner leads formed on a board, interconnections extending from the inner leads, and a lead wire formed on the board to connect the interconnections to each other, the method comprising:
   electroplating the inner leads by dipping the board in an electroplating solution and carrying a current to the inner leads via the interconnections from the lead wire;
   making the interconnections electrically isolated from each other by removing, after electroplating, the lead wire without forming through holes on the board to break the short-circuited interconnections; and
   circuit testing for each of the interconnections.

3. A method of manufacturing a circuit board for semiconductor devices, the circuit board including inner leads formed on a board, interconnections extending from the inner leads, and a lead wire formed on the board to connect the interconnections to each other, the method comprising:
   electroplating the inner leads by dipping the board in an electroplating solution and carrying a current to the inner leads via the interconnection from the lead wire;
   making the interconnections electrically isolated from each other by removing, after electroplating, the lead wire and part of the board in the thickness direction from the surface on which the lead wire is formed by mechanical polishing to break the short-circuited interconnections; and
   circuit testing for each of the interconnections.

4. The circuit board of claim 1, further comprising semispherical terminals formed on the board opposite the interconnections.

5. The circuit board of claim 1, wherein the interconnections are subject to electric circuit testing in the state in which the semiconductor devices are mounted on the board.

6. A method of manufacturing a circuit board for semiconductor devices, the circuit board including inner leads formed on a board, interconnections extending from the inner leads, and a lead wire formed on the board to connect the interconnections to each other, the method comprising:
   electroplating the inner leads by dipping the board in an electroplating solution and carrying a current to the inner leads via the interconnections from the lead wire;
   making the interconnections electrically isolated from each other by removing, after electroplating, the lead wire by at least one of a chemical polish, mechanical polish, a chemical corrosion and a laser beam without forming through holes on the board to break the short-circuited interconnections; and
   circuit testing for each of the interconnections.

* * * * *